United States Patent
Sato et al.

(10) Patent No.: US 8,450,782 B2
(45) Date of Patent: May 28, 2013

(54) FIELD EFFECT TRANSISTOR, METHOD OF MANUFACTURING FIELD EFFECT TRANSISTOR, AND METHOD OF FORMING GROOVE

(75) Inventors: Yoshihiro Sato, Tokyo (JP); Takehiko Nomura, Tokyo (JP); Nariaki Ikeda, Tokyo (JP); Takuya Kokawa, Tokyo (JP); Masayuki Iwami, Tokyo (JP); Sadahiro Kato, Tokyo (JP)

(73) Assignee: Furukawa Electric Co., Ltd. (JP)

( * ) Notice: Subject to any disclaimer, the term of this patent is extended or adjusted under 35 U.S.C. 154(b) by 0 days.

(21) Appl. No.: 13/075,843

(22) Filed: Mar. 30, 2011

(65) Prior Publication Data

US 2011/0241088 A1    Oct. 6, 2011

Related U.S. Application Data

(60) Provisional application No. 61/406,448, filed on Oct. 25, 2010.

(30) Foreign Application Priority Data

Mar. 31, 2010  (JP) .................................. 2010-083173

(51) Int. Cl.
    *H01L 29/76* (2006.01)

(52) U.S. Cl.
    USPC ............ 257/288; 257/E21.219; 257/E21.409; 257/E29.255; 438/197; 438/706

(58) Field of Classification Search
    USPC ........... 257/288, E21.219, E21.409, E29.255; 438/197, 706
    See application file for complete search history.

(56) References Cited

FOREIGN PATENT DOCUMENTS

JP    2009188397 A  *  8/2009

\* cited by examiner

*Primary Examiner* — Marvin Payen
(74) *Attorney, Agent, or Firm* — Lowe Hauptman Ham & Berner, LLP

(57) ABSTRACT

A field effect transistor includes a high resistance layer on a substrate, a semiconductor operation layer that is formed on the high resistance layer and includes a channel layer that has the carbon concentration of not more than $1 \times 10^{18}$ cm$^{-3}$ and has the layer thickness of more than 10 nm and not more than 100 nm, a recess that is formed up to the inside of the channel layer in the semiconductor operation layer, source and drain electrodes that are formed on the semiconductor operation layer with the recess intervening therebetween, a gate insulating film that is formed on the semiconductor operation layer so as to cover the recess, and a gate electrode that is formed on the gate insulating film in the recess.

7 Claims, 8 Drawing Sheets

| ITEM | FIRST CONDITION | | SECOND CONDITION |
|---|---|---|---|
| | ALTERED LAYER REMOVING CONDITION | GROOVE FORMING CONDITION | |
| TYPE OF GAS | CHLORINE | CHLORINE | CHLORINE |
| ANTENNA POWER [W] | 600 | 300 | 300 |
| BIAS POWER [W] | 75 | 25 | 25 |
| PRESSURE [Pa] | 1 | 1 | 1 |
| SUBSTRATE TEMPERATURE [°C] | 20 | 20 | 20 |

FIG.12

|  | AVERAGE ETCHING RATE [nm/min] | STANDARD DEVIATION | VARIATION [%] [STANDARD DEVIATION/ AVERAGE] |
|---|---|---|---|
| SECOND CONDITION | 0.14 | 0.03 | 20.8 |
| FIRST CONDITION | 0.86 | 0.05 | 5.3 |

FIG.13

| ITEM | UNIT | EXAMPLE 1 | EXAMPLE 2 | COMPARISON EXAMPLE 1 | COMPARISON EXAMPLE 2 |
|---|---|---|---|---|---|
| CARBON CONCENTRATION (MEASURED BY SIMS) | $cm^{-3}$ | $1.00 \times 10^{18}$ | $5.00 \times 10^{17}$ | $2.00 \times 10^{19}$ | $7.00 \times 10^{19}$ |
| ON-RESISTANCE | $m\Omega \cdot cm^2$ | 12 | 10 | 70 | 203 |
| BREAKDOWN VOLTAGE | V | 840 | 1860 | 660 | 620 |
| THICKNESS OF CHANNEL LAYER | nm | 100 | 50 | 200 | 800 |

FIELD EFFECT TRANSISTOR, METHOD OF MANUFACTURING FIELD EFFECT TRANSISTOR, AND METHOD OF FORMING GROOVE

CROSS-REFERENCE TO RELATED APPLICATIONS

This application is based upon and claims the benefit of priority from the prior Japanese Patent Application No. 2010-083173, filed on Mar. 31, 2010 based upon Japanese Patent Application No. 2009-087361, filed on Mar. 31, 2009 and U.S. Provisional Patent Application No. 61/406,448, filed on Oct. 25, 2010; the entire contents of which are incorporated herein by reference.

BACKGROUND OF THE INVENTION

1. Field of the Disclosure

The invention relates to a field effect transistor, a method of manufacturing the field effect transistor, and a method of forming a groove.

2. Description of the Related Art

Wide bandgap semiconductors formed of a III-V nitride compound represented by $Al_xIn_yGa_{1-x-y}As_uP_vN_{1-u-v}$ ($0 \leq x \leq 1$, $0 \leq y \leq 1$, $x+y \leq 1$, $0 \leq u < 1$, $0 \leq v < 1$, $u+v < 1$) are very attractive as semiconductor device materials for use in a high temperature, high power, or high frequency environment because they have a high dielectric breakdown voltage, a favorable electron transport property, and a favorable thermal conductivity. For example, a field effect transistor (FET) having an AlGaN/GaN hetero-junction structure generates two-dimensional electron gas in the hetero-junction interface due to a piezoelectric effect. The two-dimensional electron gas has a high electron mobility and carrier density. Therefore, the hetero-junction FET (HFET) having the AlGaN/GaN hetero structure has a low on-resistance and a fast switching speed and is operable in a high temperature environment. These features are fairly suitable for power switching.

A normal AlGaN/GaN HFET is a normally-on device in which a current flows when a bias is not imposed on a gate and a current is interrupted when a negative potential is imposed on the gate. When it is applied to power switching, however, a normally-off device is preferable, in which a current does not flow when a bias is not imposed on a gate and a current flows when a positive potential is imposed on the gate, with a view to securing the safety when the device is broken. For this reason, a field effect transistor (hereinafter, "MOSFET") that employs a MOS structure to realize the normally-off device is disclosed (refer to Japanese Patent Laid-Open No. 2009-188397). The field effect transistor has a recess (groove) with the depth of about 120 nm to 150 nm formed in the gate region.

In the field effect transistor, a lower semiconductor layer (channel layer) that forms the bottom of the recess to form a channel is formed of p-GaN. This channel layer is grown by introducing trimethyl gallium (TMGa) as the material gas at the flow rate of 54 μmol/min. As the result, the channel layer has a low electron mobility because of the relatively highly concentrated carbon added through auto doping of carbon included in TMGa.

In order to realize a field effect transistor with a high power efficiency and a low on-resistance, it is preferable that the electron mobility in the channel layer is higher. However, when the carbon concentration of the channel layer is decreased in order to enhance the electron mobility, a sufficient breakdown voltage cannot be obtained disadvantageously.

BRIEF SUMMARY OF THE INVENTION

It is an object of the present invention to at least partially solve the problems in the conventional technology.

According to an aspect of the present invention, there is provided a field effect transistor made of a nitride compound semiconductor. The field effect transistor includes: a substrate; a high resistance layer that is formed on the substrate; a semiconductor operation layer that is formed on the high resistance layer and includes a channel layer that has a carbon concentration of not more than $1 \times 10^{18}$ cm$^{-3}$ and a layer thickness of more than 10 nm and not more than 100 nm; a recess that is formed up to an inside of the channel layer in the semiconductor operation layer; a source electrode and a drain electrode that are formed on the semiconductor operation layer with the recess intervening therebetween; a gate insulating film that is formed on the semiconductor operation layer so as to cover the recess; and a gate electrode formed on the gate insulating film in the recess.

According to another aspect of the present invention, there is provided a method of manufacturing a field effect transistor made of a nitride compound semiconductor. The method includes: forming a high resistance layer on a substrate; forming a semiconductor operation layer including a channel layer on the high resistance layer, the channel layer having a carbon concentration of not more than $1 \times 10^{18}$ cm$^{-3}$ and having a layer thickness of more than 10 nm and not more than 100 nm; forming a recess from a top surface of the semiconductor operation layer up to an inside of the channel layer; forming a source electrode and a drain electrode on the semiconductor operation layer with the recess intervening therebetween; forming a gate insulating film on the semiconductor operation layer so as to cover the recess; and forming a gate electrode on the gate insulating film in the recess.

According to still another aspect of the present invention, there is provided a method of forming a groove in a nitride compound semiconductor. The method includes: removing an altered layer formed on a surface of the nitride compound semiconductor through dry etching; and forming a groove on the surface of the nitride compound semiconductor, from which the altered layer is removed, through dry etching at a lower bias power than that of the dry etching in the removing an altered layer.

These and other objects, features, aspects, and advantages of the present disclosure will become apparent to those skilled in the art from the following detailed description, which, taken in conjunction with the annexed drawings, discloses preferred embodiments of the present disclosure.

BRIEF DESCRIPTION OF THE DRAWINGS

FIG. 12 is a table illustrating etching property;

FIG. 13 is a table illustrating carbon concentration and device property of the channel layer in the MOSFET according to first and second examples and first and second comparison examples.

DESCRIPTION OF THE PREFERRED EMBODIMENTS

Hereinafter, exemplary embodiments of a field effect transistor, a method of manufacturing the field effect transistor, and a method of forming a groove according to the present invention will be described in detail with reference to the attached drawings. The present invention is not limited to these embodiments but various kinds of modifications are possible without departing from the scope of the invention.

Figure 1:
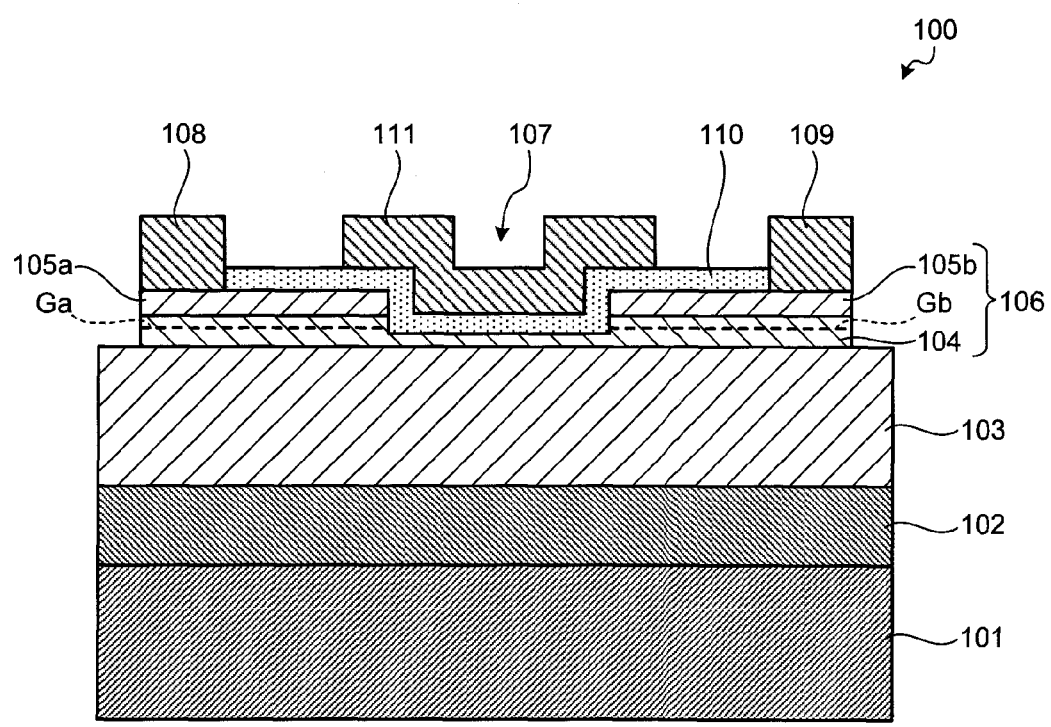
FIG. 1 is a schematic cross-sectional view of MOSFET according to a first embodiment of the invention.

FIG. 1 is a schematic cross-sectional view of MOSFET 100 according to the first embodiment of the present invention. The MOSFET 100 includes a buffer layer 102, a high resistance layer 103, a channel layer 104, and carrier supplying layers 105a and 105b, on a substrate 101 that is formed of Si and of which the main surface is the surface (111). The buffer layer 102 is formed in a laminated structure of AlN/GaN. The high resistance layer 103 is formed on the buffer layer 102. The channel layer 104 is formed on the high resistance layer 103. The carrier supplying layers 105a and 105b are formed on the channel layer 104. The channel layer 104 and the carrier supplying layers 105a and 105b form a semiconductor operation layer 106. These carrier supplying layers 105a and 105b are isolated by a recess 107 that is formed up to the inside of the channel layer 104.

The MOSFET 100 further includes a source electrode 108 and a drain electrode 109 that are respectively formed on the carrier supplying layers 105a and 105b with the recess 107 intervening therebetween. The MOSFET 100 further includes a gate insulating film 110 and a gate electrode 111 to form the MOS structure. The gate insulating film 110 is formed of $SiO_2$ on the carrier supplying layers 105a and 105b to cover the recess 107. The gate electrode 111 is formed on the gate insulating film 110 around the recess 107.

The high resistance layer 103 is formed of GaN that has a higher electric resistance than that of the channel layer 104, for example, that has the carbon concentration of more than $1 \times 10^{18}$ cm$^{-3}$. The channel layer 104 is formed of GaN that has the carbon concentration of not more than $1 \times 10^{18}$ cm$^{-3}$ and the layer thickness of more than 10 nm and not more 100 nm. The carrier supplying layers 105a and 105b are formed of AlGaN that has a higher bandgap energy than that of GaN forming the channel layer 104. For example, the layer thickness of the carrier supplying layers is 1 nm to 50 nm, preferably 20 nm to 25 nm. The carrier supplying layers 105a and 105b have Al composition of 25%. However, the Al composition is not restrictive and may be set, for example, to 1% to 99%.

Due to a difference of the bandgap energy between the channel layer 104 and the carrier supplying layers 105a and 105b, the channel layer 104 has areas Ga and Gb, in which two-dimensional electron gas with high mobility is generated, in hetero-junction interfaces with the carrier supplying layers 105a and 105b. The carrier concentration of the two-dimensional electron gas areas Ga and Gb is preferably about $1 \times 10^{12}$ cm$^{-2}$ to $2 \times 10^{13}$ cm$^{-2}$. Because the two-dimensional electron gas areas Ga and Gb are isolated by the recess 107, a channel is formed on the lower side of the recess 107 in the channel layer 104 to flow a drain current during the device operation in the normally-off type MOSFET 100.

The MOSFET 100 can have a low on-resistance and a high breakdown voltage as will be described below because the carbon concentration of the channel layer 104 formed on the high resistance layer 103 is not more than $1 \times 10^{18}$ cm$^{-3}$ and the layer thickness thereof is more than 10 nm and not more than 100 nm.

Figure 2:
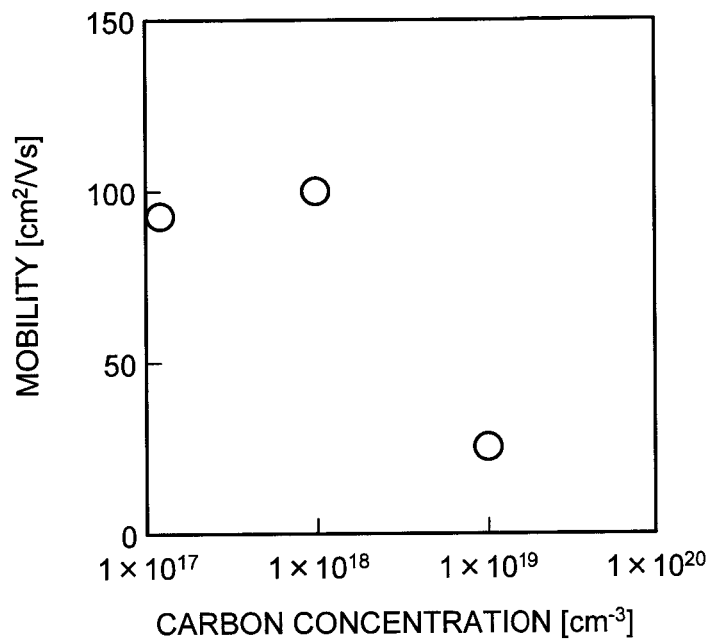
FIG. 2 is a graph illustrating a relation between carbon concentration and electron mobility in a semiconductor layer formed of GaN.

FIG. 2 is a graph illustrating the experiment result that indicates a relation between the carbon concentration and the electron mobility in the semiconductor layer formed of GaN. As illustrated in FIG. 2, the mobility is substantially constant when the carbon concentration is equal to or less than $1 \times 10^{18}$ cm$^{-3}$. However, when the carbon concentration becomes more than $10^{18}$ cm$^{-3}$, the mobility is rapidly decreased. When the carbon concentration is $1 \times 10^{19}$ cm$^{-3}$, the mobility becomes about ⅕ of that in the case of $1 \times 10^{18}$ cm$^{-3}$. Because the on-resistance is in inverse proportion to the mobility of the carrier in the channel layer 104, the on-resistance in the carbon concentration of $1 \times 10^{19}$ cm$^{-3}$ becomes about five times of that of $1 \times 10^{18}$ cm$^{-3}$.

Because the carbon concentration of the channel layer 104 is equal to or less than $1 \times 10^{18}$ cm$^{-3}$, the MOSFET 100 shows a higher electron mobility and a lower on-resistance as illustrated in FIG. 2. The lower carbon concentration of the channel layer 104 is more preferable. Actually, it is preferable that the carbon concentration be equal to or more than $1 \times 10^{16}$ cm$^{-3}$.

However, when the carbon concentration of the channel layer 104 is low as mentioned above, there is a possibility that the channel layer 104 generates a leakage due to its low electric resistance. For this reason, in the MOSFET 100, the channel layer 104 is formed on the high resistance layer 103 and the thickness of the channel layer 104 is more than 10 nm and not more than 100 nm. As a result, the electron mobility in the channel layer 104 is enhanced to realize a low on-resistance. At the same time, the electric resistance in the channel layer 104 and its lower layer is enhanced to suppress the generation of a leakage and to enhance the breakdown voltage.

Figure 3:
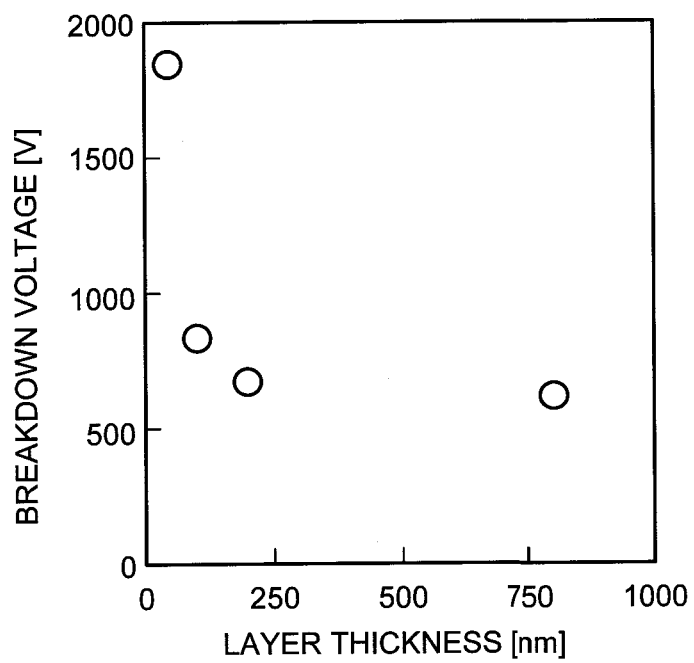
FIG. 3 is a graph illustrating a relation between layer thickness and breakdown voltage of a channel layer.

FIG. 3 is a graph illustrating the experiment result that indicates a relation between the layer thickness and the breakdown voltage of the channel layer when two electrodes are provided on the top surface of stacked semiconductor layers and are applied with a voltage, in which the stacked semiconductor layers include the substrate/buffer layer/high resistance layer/channel layer similar to those of the MOSFET 100 and do not include a recess. In this case, the carbon concentration of the channel layer 104 is defined as $1 \times 10^{18}$ cm$^{-3}$ and the sheet resistance of the high resistance layer 103 is defined as $1 \times 10^5$ Ωcm as a volume resistivity. As illustrated in FIG. 3, when the layer thickness of the channel layer 104 is equal to or more than 200 nm, the breakdown voltage is substantially constant as about 680V. However, when the layer thickness is 100 nm, the breakdown voltage is raised up to about 850V. Furthermore, when the layer thickness is 50 nm, the breakdown voltage is rapidly raised to 1850V.

Because the MOSFET 100 has the channel layer 104 with the thickness of equal to or less than 100 nm, the MOSFET 100 can achieve a high breakdown voltage similarly to the result illustrated in FIG. 3. As apparent from the result illustrated in FIG. 3, the higher breakdown voltage can be further achieved by setting the thickness of the channel layer 104 to a value equal to or less than 50 nm. In order to suppress a decrease in the mobility caused by the high resistance layer 103 just below the channel layer 104, it is preferable that the thickness from the bottom of the recess 107 to the lower surface of the channel layer 104 (namely, the interface with the high resistance layer 103) is equal to or more than 10 nm. Therefore, the channel layer 104 is preferably thicker than "the necessary depth of the recess in the channel layer+10 nm".

As mentioned above, the MOSFET 100 according to the first embodiment can obtain a low on-resistance and a high breakdown voltage.

Next, a method of manufacturing the MOSFET 100 will be described. FIGS. 4 to 9 are process views explaining an example of a method of manufacturing the MOSFET 100. In the following description, the case of using the metal organic chemical vapor deposition (MOCVD) will be described but a crystal growing method is not restricted particularly.

Figure 4:
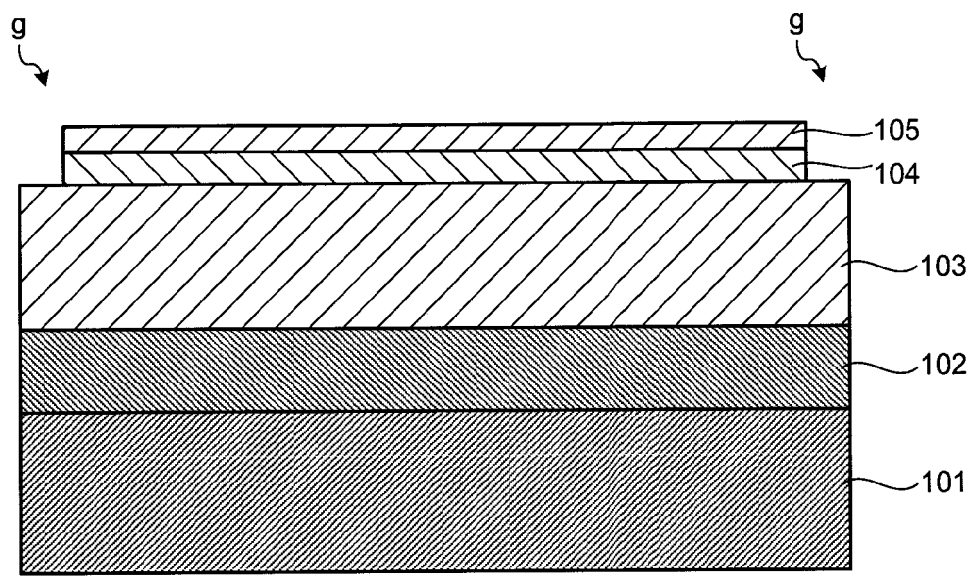
FIGS. 4 to 9 are views explaining an example of a method for manufacturing MOSFET shown in FIG. 1.

At first, as illustrated in FIG. 4, the substrate 101 that is made of Si and has the main surface (111) is set in an MOCVD apparatus. Trimethyl gallium (TMGa), trimethyl aluminum (TMAl), and $NH_3$ are properly combined and introduced respectively at the flow rate of 58 μmol/min, 100 μmol/min, and 121 μmol/min by using hydrogen gas with 100% concentration as carrier gas to epitaxially grow the buffer layer 102 and the high resistance layer 103 made of GaN on the substrate 101 at the growing temperature 1050° C. and the growing pressure 50 Torr. Next, TMGa and $NH_3$ are introduced respectively at the flow rate of 19 μmol/min and 121 μmol/min to epitaxially grow the channel layer 104 made of GaN on the high resistance layer 103 at the growing temperature 1050° C. and the growing pressure 200 Torr. At this stage, carbon is added to the high resistance layer 103 and the channel layer 104 due to the auto doping of carbon included in TMGa. The concentration of the added carbon can be adjusted according to the growing conditions such as the flow rate of TMGa, the vacuum degree within the apparatus, and the growing speed. For example, in the case of the flow rate of TMGa, the carbon concentration of the high resistance layer 103 can be $3\times10^{-19}$ $cm^{-3}$ and the carbon concentration of the channel layer 104 can be $5\times10^{-17}$ $cm^{-3}$.

Then, TMAl, TMGa, and $NH_3$ are further introduced respectively at the flow rate of 125 μmol/min, 19 μmol/min, and 121 μmol/min to epitaxially grow the carrier supplying layer 105 made of AlGaN including 25% Al composition on the channel layer 104, and thus the semiconductor operation layer 106 is formed.

As an example showing the layer thicknesses of the respective semiconductor layers, the buffer layer 102 is made by stacking eight GaN/AlN composite layers with the layer thickness of 200 nm/20 nm on the AlN layer with the thickness of 100 nm. The thickness of the high resistance layer 103 is 500 nm and the thickness of the carrier supplying layer 105 is 20 nm. The thickness of the channel layer 104 is not more than 100 nm and more than 10 nm, preferably not more than 50 nm, for example, 30 nm. In order that the recess 107 to be formed after that may restrain the deterioration in the mobility caused by the high resistance layer 103 just under the channel layer 104, it is preferable that the thickness from the bottom of the recess 107 to the lower surface of the channel layer 104 (namely, the interface with the high resistance layer 103) is equal to or more than 10 nm and that the channel layer 104 is thicker than 10 nm. Because the recess 107 is formed up to the inside of the channel layer 104, needless to say, it is preferable that the channel layer 104 is thicker than "the necessary depth of the recess in the channel layer+10 nm".

Then, photoresist is applied to the surface of the carrier supplying layer 105 and a pattern for isolation is formed by using the photolithography. After that, a groove g for isolation is formed through dry etching such as the inductively coupled plasma reactive ion etching (ICP-RIE). Then, the photoresist is removed.

Figure 5:
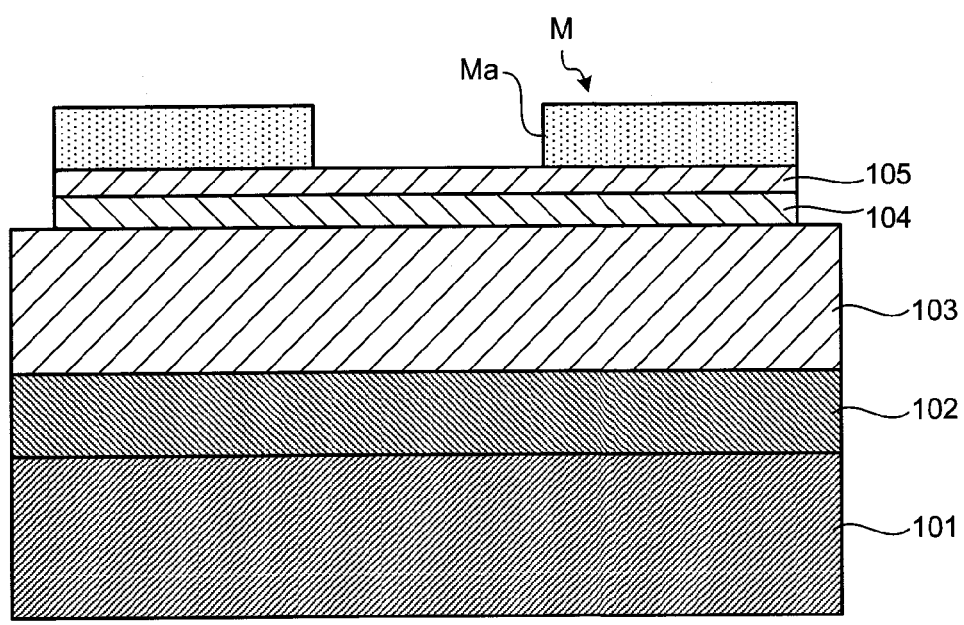

Next, as illustrated in FIG. 5, a mask layer M made of $SiO_2$ is formed with the thickness of 500 nm on the carrier supplying layer 105 by using the plasma chemical vapor deposition (PCVD), and patterning is performed by using the photolithography and $CF_4$ gas to form an opening Ma.

Figure 6:
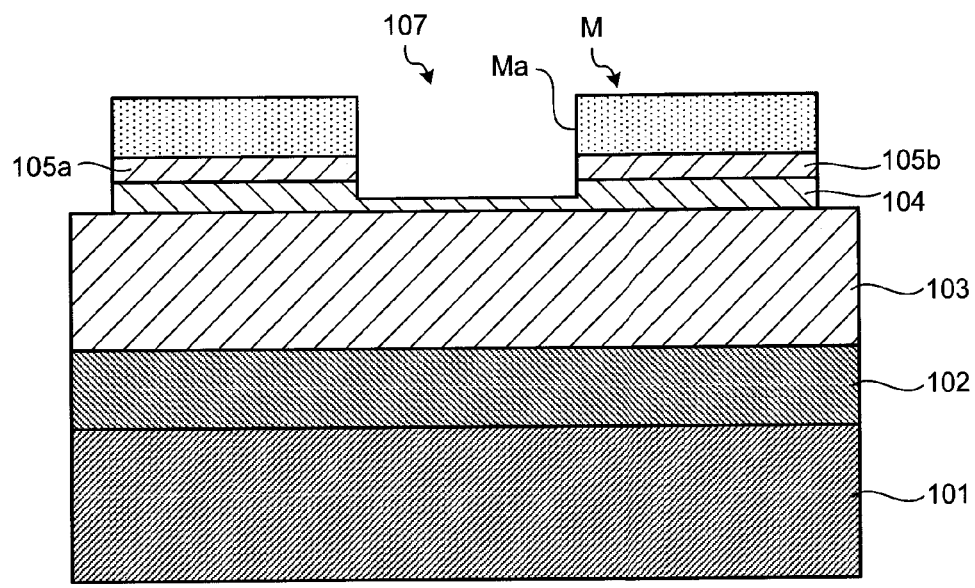

As illustrated in FIG. 6, the recess 107 is formed by etching the carrier supplying layer 105 and the channel layer 104 by the ICP-RIE process, in which the mask layer M is used as a mask and chlorine ($Cl_2$) gas is, for example, used as etching gas, from the top surface of the carrier supplying layer 105 that is the top surface of the semiconductor operation layer 106 up to the inside of the channel layer 104. According to this, the carrier supplying layers 105a and 105b are formed.

In this case, the thickness of the channel layer 104 is more than 10 nm and not more than 100 nm. In order to restrain a decrease in the mobility caused by the high resistance layer 103, it is preferable that the thickness from the bottom of the recess 107 to the lower surface of the channel layer 104 is equal to or more than 10 nm. Therefore, the depth of the recess 107 should be controlled accurately. However, it is difficult to accurately control the depth of the recess under the conventional etching conditions.

As a result of the investigation for the cause of the above problem, the inventors have found that an altered layer supposed to be made of an oxide layer is formed on its exposed surface in a nitride compound semiconductor. Because this altered layer is difficult to be etched, it takes different time to remove the altered layer depending on its state, and thus the depth of the recess varies even in the same etching time.

After due consideration, as a preferred method of forming a recess, the inventors realize an accurate control of the depth of the recess by performing an altered layer removing process for removing an altered layer through dry etching and a groove forming process for forming a recess on the surface with the altered layer removed therefrom through dry etching performed at a bias power lower than that of the dry etching in the altered layer removing process, as will be described later.

Figure 7:
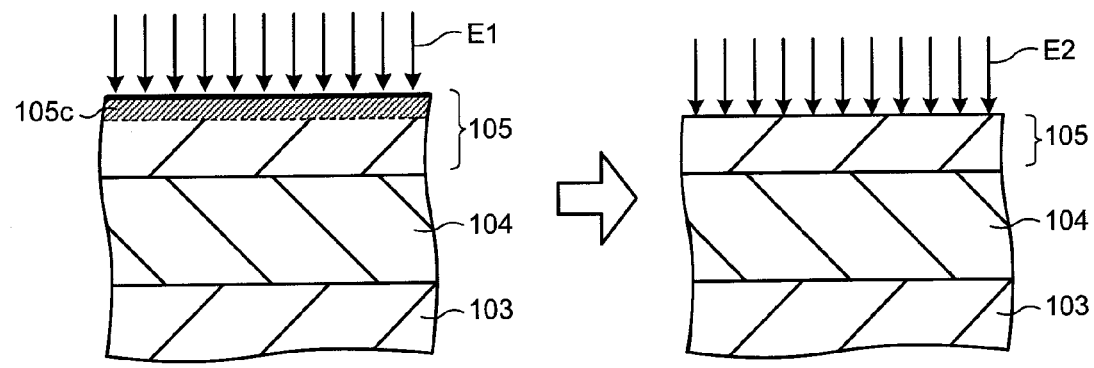

As illustrated in FIG. 7, an altered layer 105c is formed on the top surface of the carrier supplying layer 105 that is the top surface of the semiconductor operation layer 106. The altered layer 105c is supposed to be formed during the process after the growth of the carrier supplying layer 105. Therefore, in this process, the substrate 101 with the epitaxial layer formed up to the carrier supplying layer 105 is first set in a chamber of the ICP-RIE apparatus, and chloride gas is introduced as etching gas. Next, a predetermined antenna power is supplied to a high frequency antenna within the chamber to generate etching gas plasma. Furthermore, a bias power is supplied to the lower electrode and ion E1 of the etching gas is induced to the substrate 101 to be hit on the carrier supplying layer 105. As a result, the altered layer 105c is etched away (altered layer removing process). At this stage, for example, the antenna power and the bias power are respectively set to 600 W and 75 W that are comparatively higher power. According to this, the altered layer 105c is quickly removed. It is only necessary that the etching in the altered layer removing process is performed at a self-bias voltage equal to or more than 100V in addition to the above-mentioned antenna power and bias power.

Next, the antenna power and the bias power are respectively set to 300 W and 25 W that are low power. The etching gas of ion E2 is induced and hit on the carrier supplying layer 105 made of AlGaN from which the altered layer 105c is removed, and a groove is formed into a predetermined depth to form the recess 107 (groove forming process). It is only necessary that the etching in the altered layer removing process is performed at the self-bias voltage less than 100V in addition to the above-mentioned antenna power and bias power.

In this way, because the altered layer removing process is first performed at a relatively higher antenna power and bias power and the groove forming process is then performed at a lower antenna power and bias power, the altered layer 105c can be removed quickly and with a good reproducibility. As the result, the depth of the recess 107 can be accurately controlled without fluctuation by adjusting the etching time of the groove forming process.

Assuming that the recess 107 is formed by only the setting of power in the altered layer removing process, because the power of the etching is too high for the channel layer 104 and the carrier supplying layer 105 from which the altered layer 105c is removed, the etching speed gets faster. As a result, it is difficult to control the depth and is easy to make the etched surface rough. Assuming that the recess 107 is formed by only the setting of power in the groove forming process, because it takes a longer time to remove the altered layer 105c and the removing time has variations as mentioned above, the depth of the recess 107 has variations. Therefore, the control of the depth is difficult.

In this process, although the antenna power and the bias power are set higher in the altered layer removing process, the altered layer 105c can be removed quickly with a good reproducibility when at least the bias power is set higher. The altered layer removing process can be switched to the groove forming process at a time at which a predetermined time required for removing the altered layer is passed, which is obtained by a preliminary experiment, from starting the etching in the altered layer removing process. For example, the altered layer removing process can be switched to the groove forming process when monitoring the surface condition of the carrier supplying layer 105 and confirming that the altered layer 105c is removed.

Figure 8:
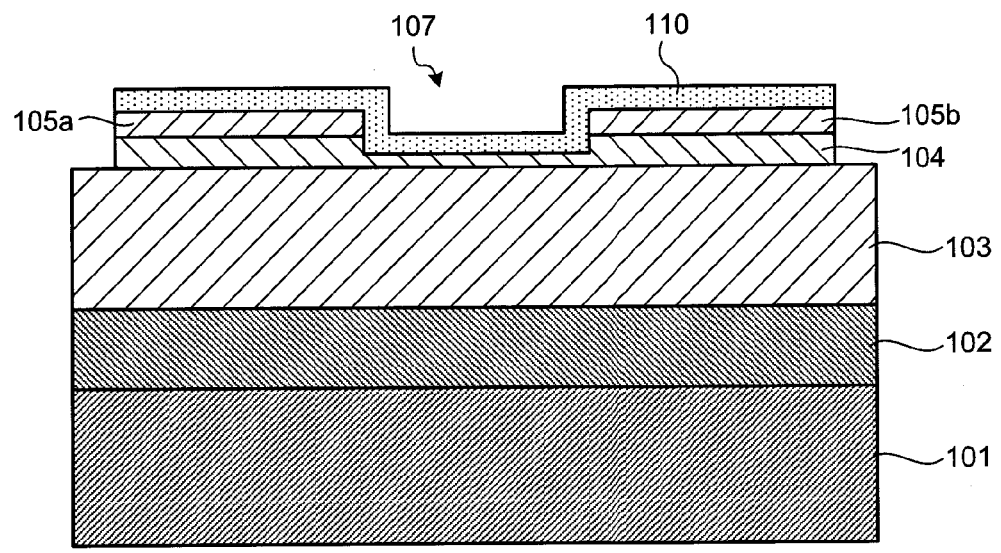

After the recess 107 is formed as mentioned above, the mask layer M is removed, and the gate insulating film 110, which is made of $SiO_2$ and has, for example, the thickness of 60 nm, is formed on the exposed surfaces of the carrier supplying layers 105a and 105b and the surface of the channel layer 104 in the recess 107 by using the PCVD method in which $SiH_4$ and $N_2O$ are used as material gas, as illustrated in FIG. 8.

Figure 9:
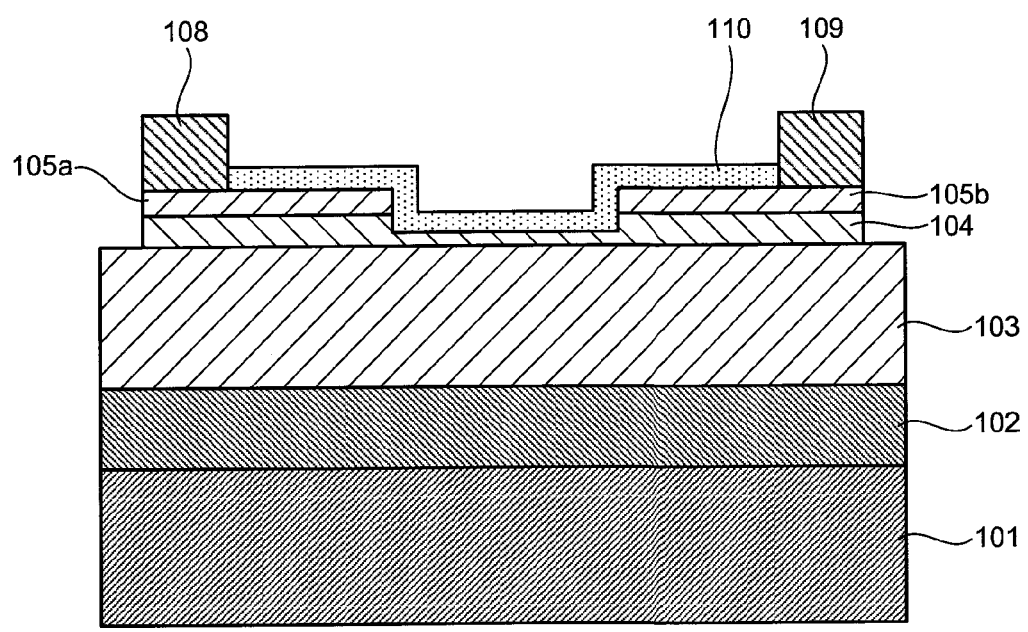

Next, as illustrated in FIG. 9, a part of the gate insulating film 110 is removed with hydrofluoric acid, and the source electrode 108 and the drain electrode 109 are formed on the carrier supplying layers 105a and 105b with the recess 107 intervening therebetween by using the lift-off method. Both the source electrode 108 and the drain electrode 109 have the Ti/Al structure with the thickness of 25 nm/300 nm. A metal film can be formed by using the sputtering method and vacuum deposition method. After the source electrode 108 and the drain electrode 109 are formed, annealing is performed at 600° C. for 10 minutes.

At the last, the gate electrode 111 having the structure of Ti/Al/Ti is formed on the gate insulating film 110 of the recess 107 by using the lift-off method so as to complete the formation of the MOSFET 100 illustrated in FIG. 1.

Next, the invention will be described more specifically by using the first and second examples and the first and second comparison examples of the invention. The MOSFET having the same structure as that illustrated in FIG. 1 is manufactured by using the above-mentioned manufacturing method as the first and second examples and the first and second comparison examples. As for the MOSFET of the first example, the thickness of the channel layer is set to 100 nm and the carbon concentration is set to $1.00 \times 10^{18}$ cm$^{-3}$. As for the MOSFET of the second example, the thickness of the channel layer is set to 50 nm and the carbon concentration is set to $5.00 \times 10^{17}$ cm$^{-3}$. Furthermore, as for the MOSFET of the first comparison example, the thickness of the channel layer is set to 200 nm and the carbon concentration is set to $2.00 \times 10^{19}$ cm$^{-3}$. As for the MOSFET of the second comparison example, the thickness of channel layer is set to 800 nm and the carbon concentration is set to $7.00 \times 10^{19}$ cm$^{-3}$.

When manufacturing the MOSFET according to the first and second examples and the first and second comparison examples, a recess is formed by using a first recess forming process that includes the altered layer removing process and the groove forming process as mentioned above. Hereinafter, the fact that a recess with the accurately controlled depth can be formed by using the first recess forming process will be described by comparison with the case of a second recess forming process that is performed at a constant etching power.

Figures 10, 11:
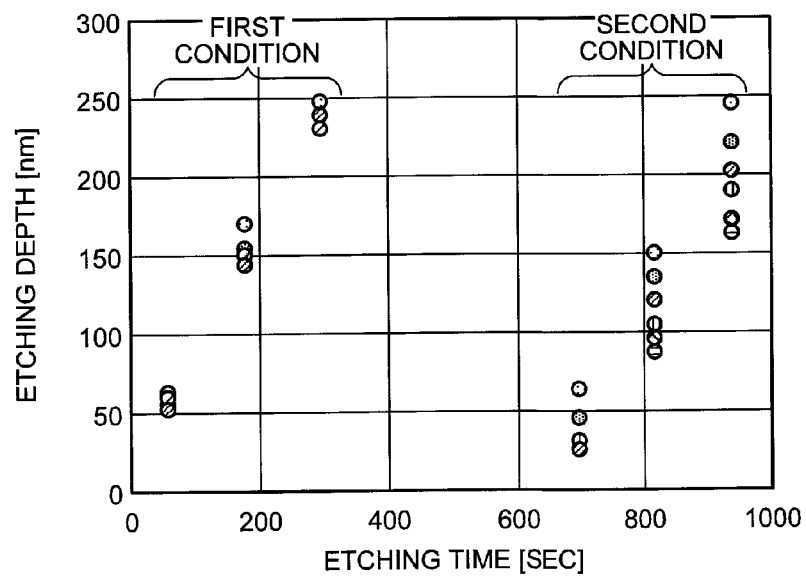
FIG. 10 is a table illustrating an etching condition in a recess forming process.
FIG. 11 is a graph illustrating a relation between etching time and etching depth.

FIG. 10 is a graph illustrating the etching condition in the recess forming process. As illustrated in FIG. 10, under the condition (first condition) of the first recess forming process and the condition (second condition) of the second recess forming process, the etching gas is chlorine gas, the pressure within the chamber of the ICP-RIE apparatus is 1 Pa, and the substrate temperature is 20° C. Under the first condition, the antenna power of the ICP-RIE apparatus is set to 600 W and the bias power is set to 75 W as the condition for the altered layer removing process, and the antenna power is set to 300 W and the bias power is set to 25 W as the condition for the groove forming process. The altered layer removing process is switched to the groove forming process at a time at which 10 seconds is passed from starting the etching under the altered layer removing condition. Under the second condition, the antenna power is set to 300 W and the bias power is set to 25 W. Under both the first condition and the second condition, the formation of a recess is performed on a plurality of samples.

FIG. 11 is a graph illustrating a relation between the etching time and the etching depth (depth of the recess) as for the first condition and the second condition. As illustrated in FIG. 11, under the second condition, the etching depth is substantially zero until the etching time becomes about 600 seconds and the etching starts when it exceeds 600 seconds. In this case, the etching depth has a great variation. Under the second condition, it is supposed that the altered layer is removed up to the etching time of about 600 seconds.

On the contrary, under the first condition, the etching depth is increased just after switching to the groove forming process and reaches about 250 nm after 300 seconds. In this case, the etching depth has a small variation.

FIG. 12 is a graph illustrating the etching property under the first condition and the second condition. As illustrated in FIG. 12, the recess forming process performed under the first condition has a characteristic that the average etching rate is faster and the etching depth is efficiently controlled due to the small variation of the etching rate, compared with the case of the second condition.

Next, FIG. 13 is a graph illustrating the carbon concentration and the device property (on-resistance and breakdown voltage) of the channel layer in the MOSFET according to the first and second examples and the first and second comparison examples. The carbon concentration is measured by the secondary ion mass spectrometry (SIMS) method.

As illustrated in FIG. 13, the MOSFET according to the first and second examples has a low on-resistance and a high breakdown voltage. On the other hand, the MOSFET according to the first and second comparison examples has a high on-resistance due to the high carbon concentration of the channel layer and has a low breakdown voltage due to the large thickness of the channel layer. In the comparison examples, the breakdown voltage is hardly changed even when the thickness of the channel layer is changed from 200 nm to 800 nm. On the other hand, the breakdown voltage is highly improved when the thickness of the channel layer is changed only by 100 nm from the first comparison example to the first example.

Figure 14:
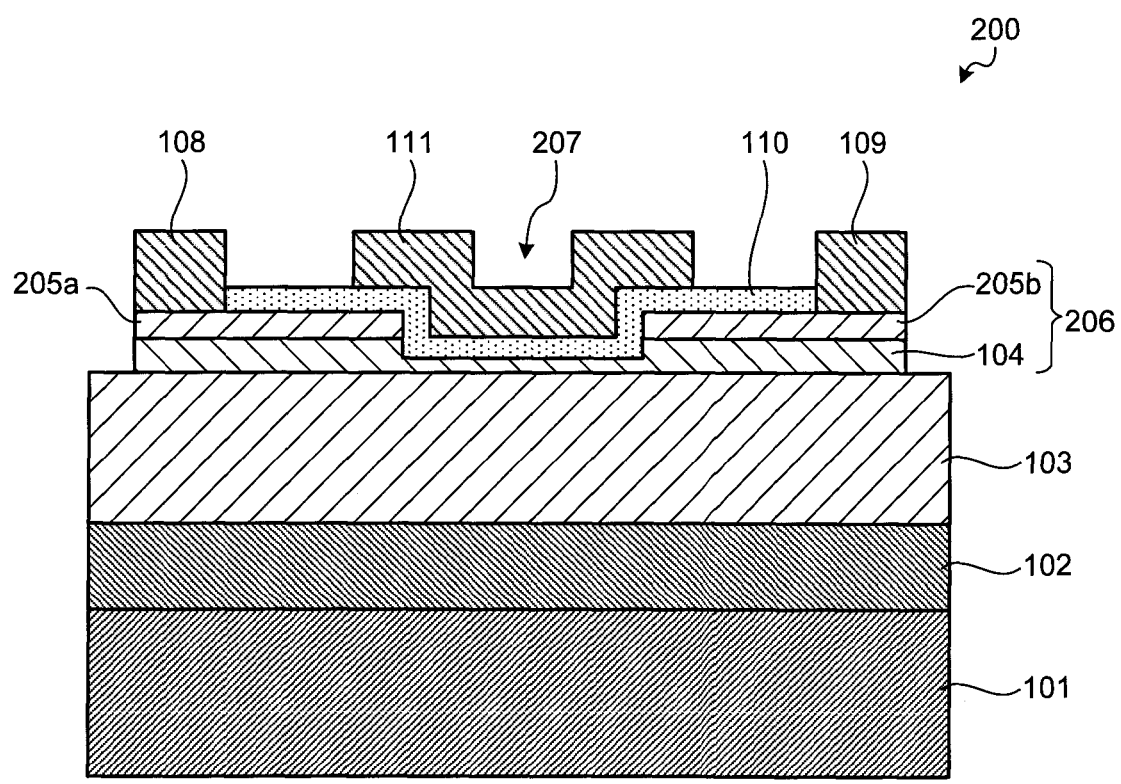
FIG. 14 is a schematic cross-sectional view of MOSFET according to a second embodiment.

Next, it will be explained about the second embodiment of the present invention. FIG. 14 is a schematic cross-sectional view of MOSFET 200 according to the second embodiment. As illustrated in FIG. 14, the MOSFET 200 includes a semiconductor operation layer 206 that includes n-type RESURF layers 205a and 205b formed of n$^-$-GaN instead of the carrier supplying layers 105a and 105b of the MOSFET 100 illustrated in FIG. 1. In the semiconductor operation layer 206, a recess 207 is formed up to the inside of the channel layer 104. In this case, the n-type RESURF layers 205a and 205b have, for example, the thickness of 100 nm and are added with n-type dopant Si at the concentration of about $5 \times 10^{17}$ cm$^{-3}$.

Because the thickness of the channel layer 104 is not more than 100 nm and more than 10 nm, preferably not more than 50 nm and the carbon concentration is not more than $1 \times 10^{18}$ cm$^{-3}$, the MOSFET 200 also has a low on-resistance and a high breakdown voltage.

Furthermore, the MOSFET 200 can be manufactured in the same method as that of manufacturing the MOSFET 100 according to the first embodiment.

Although semiconductor layers forming the MOSFET are formed of GaN or AlGaN in the above embodiments, they may be formed of another nitride compound semiconductor. Furthermore, the substrate is not limited to Si substrate, but any other substrate capable of growing crystals of the nitride compound semiconductor may be used such as SiC substrate, sapphire substrate, GaN substrate, MgO substrate, and ZnO substrate.

The field effect transistor according to the invention is not limited to the above embodiments. For example, the high resistance layer 103 may be deleted from the respective structures of the first and second embodiments and the channel layer 104 may be formed directly on the high-resistance buffer layer 102 including an AlN insulating layer.

Furthermore, the groove forming method, which includes the altered layer removing process for removing an altered layer formed on the surface of a nitride compound semiconductor through dry etching and the groove forming process for forming a groove on the surface of the nitride compound semiconductor from which the altered layer is removed through dry etching at a lower bias power than the bias power in the dry etching of the altered layer removing process, may be also applied to the case where any other groove with an accurately controlled depth is formed in addition to the formation of the recess in the MOSFET. For example, the groove forming method can be applied to the formation of a groove for isolation in the above embodiments and the formation of the Bragg Grating structure for selecting wavelength in an optical semiconductor element, without restriction.

As mentioned above, the field effect transistor and the method of manufacturing the field effect transistor according to the present invention are preferably applied to a field effect transistor for use in a high-temperature, high-power, or high-frequency environment. Furthermore, the method of forming the groove according to the invention is preferably applied to the case where a groove is formed on a nitride compound semiconductor.

Additional advantages and modifications will readily occur to those skilled in the art. Therefore, the disclosure in its broader aspects is not limited to the specific details, representative embodiments and alternate examples shown and described herein. Accordingly, various modifications may be made without departing from the spirit or scope of the general inventive concept as defined by the appended claims and their equivalents. Furthermore, the above-mentioned embodiments and the alternate examples can be arbitrarily combined with one another.

What is claimed is:

1. A field effect transistor made of a nitride compound semiconductor, the field effect transistor comprising:
    a substrate;
    a high resistance layer that has a carbon concentration of more than $1 \times 10^{18}$ cm$^{-3}$ and is formed on the substrate;
    a semiconductor operation layer that is formed on the high resistance layer and includes a channel layer that has a carbon concentration of not more than $1 \times 10^{18}$ cm$^{-3}$ and a layer thickness of more than 10 nm and not more than 100 nm;
    a recess that is formed up to an inside of the channel layer in the semiconductor operation layer;
    a source electrode and a drain electrode that are formed on the semiconductor operation layer with the recess intervening therebetween;
    a gate insulating film that is formed on the semiconductor operation layer so as to cover the recess; and
    a gate electrode formed on the gate insulating film in the recess.

2. The field effect transistor according to claim 1, wherein a thickness from a bottom surface of the recess to a lower surface of the channel layer is not less than 10 nm.

3. The field effect transistor according to claim 1, wherein the high resistance layer is a buffer layer in which layers made of nitride compound semiconductors having different compositions are alternately stacked.

4. The field effect transistor according to claim 1, wherein the semiconductor operation layer further includes a carrier supplying layer that is formed on the channel layer and has a bandgap energy different from that of the channel layer.

5. The field effect transistor according to claim 1, wherein the semiconductor operation layer further includes a RESURF layer that is formed on the channel layer and has a conductivity type different from that of the channel layer.

6. A method of manufacturing a field effect transistor made of a nitride compound semiconductor, the method comprising:
    forming a high resistance layer having a carbon concentration of more than $1 \times 10^{18}$ cm$^{-3}$ on a substrate;
    forming a semiconductor operation layer including a channel layer on the high resistance layer, the channel layer having a carbon concentration of not more than $1 \times 10^{18}$ cm$^{-3}$ and having a layer thickness of more than 10 nm and not more than 100 nm;
    forming a recess from a top surface of the semiconductor operation layer up to an inside of the channel layer;
    forming a source electrode and a drain electrode on the semiconductor operation layer with the recess intervening therebetween;
    forming a gate insulating film on the semiconductor operation layer so as to cover the recess; and
    forming a gate electrode on the gate insulating film in the recess.

7. The field effect transistor according to claim 1, wherein the layer thickness of the channel layer is not more than 50 nm.

* * * * *